（12） United States Patent
Liu

(10) Patent No.: US 8,330,640 B2
(45) Date of Patent: Dec. 11, 2012

(54) TERMINATION OF EDGES OF A PARABOLIC REFLECTOR IN A COMPACT RANGE

(75) Inventor: Kefeng Liu, Arlington, TX (US)

(73) Assignee: ETS Lindgren, L.P., Cedar Park, TX (US)

( * ) Notice: Subject to any disclaimer, the term of this patent is extended or adjusted under 35 U.S.C. 154(b) by 35 days.

(21) Appl. No.: 12/603,878

(22) Filed: Oct. 22, 2009

(65) Prior Publication Data

US 2010/0109932 A1 May 6, 2010

Related U.S. Application Data

(60) Provisional application No. 61/197,350, filed on Oct. 24, 2008.

(51) Int. Cl.
*H01Q 17/00* (2006.01)

(52) U.S. Cl. .......................................... 342/1

(58) Field of Classification Search ................. 342/1
See application file for complete search history.

(56) References Cited

U.S. PATENT DOCUMENTS

| | | | |
|---|---|---|---|
| 4,521,780 A * | 6/1985 | Preikschat | 342/170 |
| H514 H * | 8/1988 | Burnside et al. | 342/360 |
| 5,134,405 A * | 7/1992 | Ishihara et al. | 342/1 |
| 5,381,149 A * | 1/1995 | Dougherty et al. | 342/1 |
| 6,842,013 B1 * | 1/2005 | Meloling et al. | 324/637 |
| 2008/0297693 A1 * | 12/2008 | Lin et al. | 349/65 |
| 2009/0174557 A1 * | 7/2009 | Nikitin et al. | 340/572.7 |

* cited by examiner

*Primary Examiner* — Timothy A Brainard
(74) *Attorney, Agent, or Firm* — Christopher & Weisberg, P.A.

(57) ABSTRACT

Embodiments include an anechoic chamber lined with absorber to absorb electromagnetic energy incident upon the absorber and reflector edge interfaces. The chamber comprises a reflector to reflect waves from a source to form a substantially plane wave field in a test zone within the chamber. In some embodiments, the outer periphery of the reflector extends to the interior walls, floor and ceiling of the chamber. The outer periphery of the reflector is embedded in the absorber in some embodiments.

10 Claims, 8 Drawing Sheets

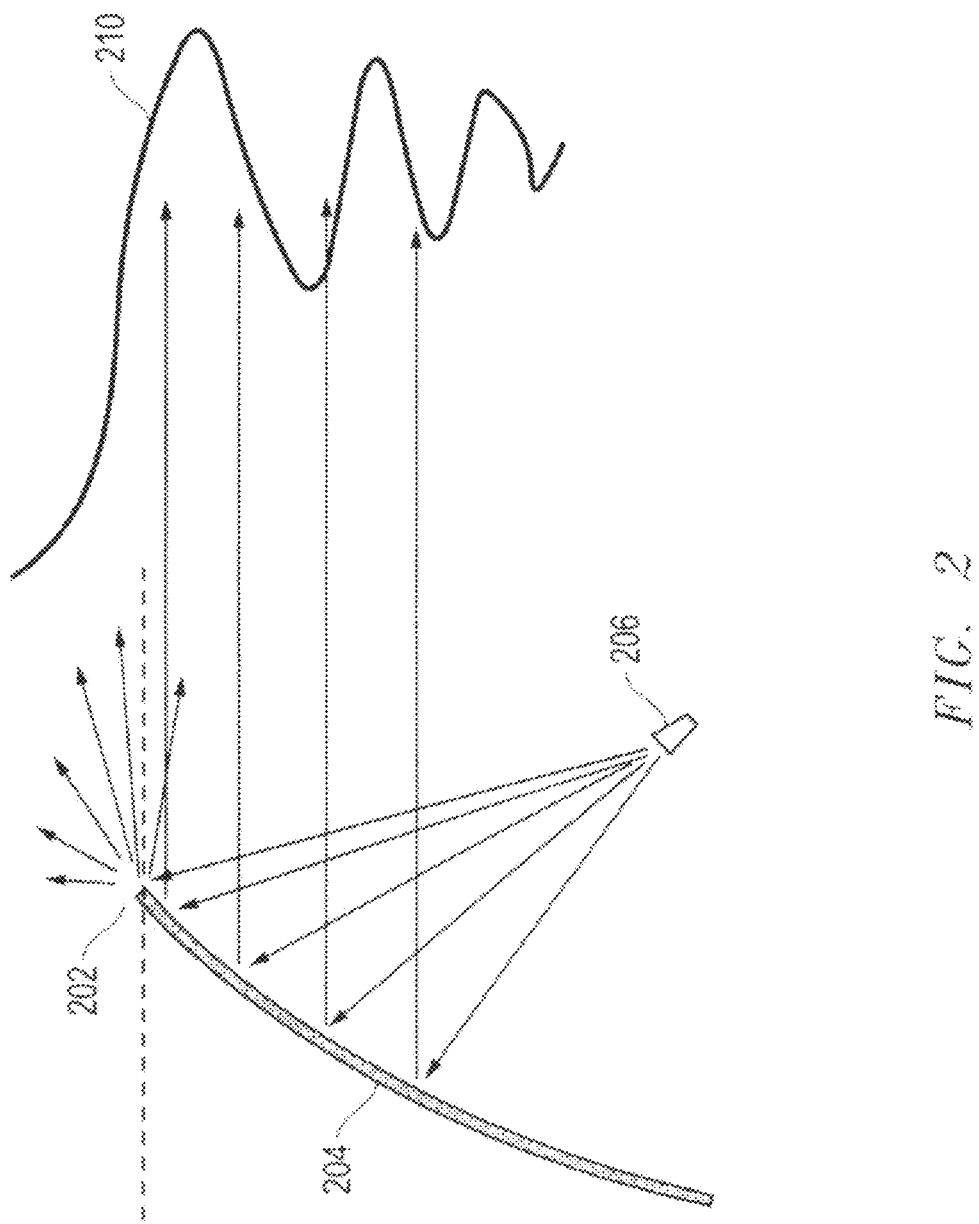

TERMINATION OF EDGES OF A PARABOLIC REFLECTOR IN A COMPACT RANGE

PRIORITY

This application claims priority of U.S. Provisional Patent Application No. 61/197,350, filed Oct. 24, 2008.

FIELD

The present description is in the field of compact range antenna and/or radar-cross-section measurement facilities.

BRIEF DESCRIPTION OF THE DRAWINGS

Aspects of the invention will become apparent upon reading the following detailed description and upon reference to the accompanying drawings in which like references may indicate similar elements:

FIG. 2 depicts edge effects at the edge of a reflector in a compact range.

DETAILED DESCRIPTION OF EMBODIMENTS

The following is a detailed description of embodiments of the invention depicted in the accompanying drawings. The embodiments are in such detail as to clearly communicate the invention. However, the amount of detail offered is not intended to limit the anticipated variations of embodiments; but, on the contrary, the intention is to cover all modifications, equivalents, and alternatives falling within the spirit and scope of the present invention as defined by the appended claims. The detailed descriptions below are designed to make such embodiments obvious to a person of ordinary skill in the art.

This description is in the field of terminating edges of a parabolic reflector in a compact range to eliminate edge diffractions, to substantially enlarge the region of a transformed plane-wave test zone, and to allow the compact range measurement technique to extend to a much lower test frequency, e.g. 100 MHz, than traditional design techniques, which is normally limited to around 1 GHz.

Embodiments include an anechoic chamber lined with absorber to absorb electromagnetic energy incident upon the interfaces of the reflector and absorbers. In one embodiment, the chamber comprises a parabolic-shaped reflector to transform wave-fronts from a spherical wave-front coming from a feed source to form a substantially planar wave-front emulating the far field test environment within a compactly sized confinement of an anechoic chamber. In some embodiments, the outer periphery of the reflector extends to the interior walls, floor and ceiling of the chamber. The outer periphery of the reflector is embedded in the absorber in some embodiments.

Figure 1A:
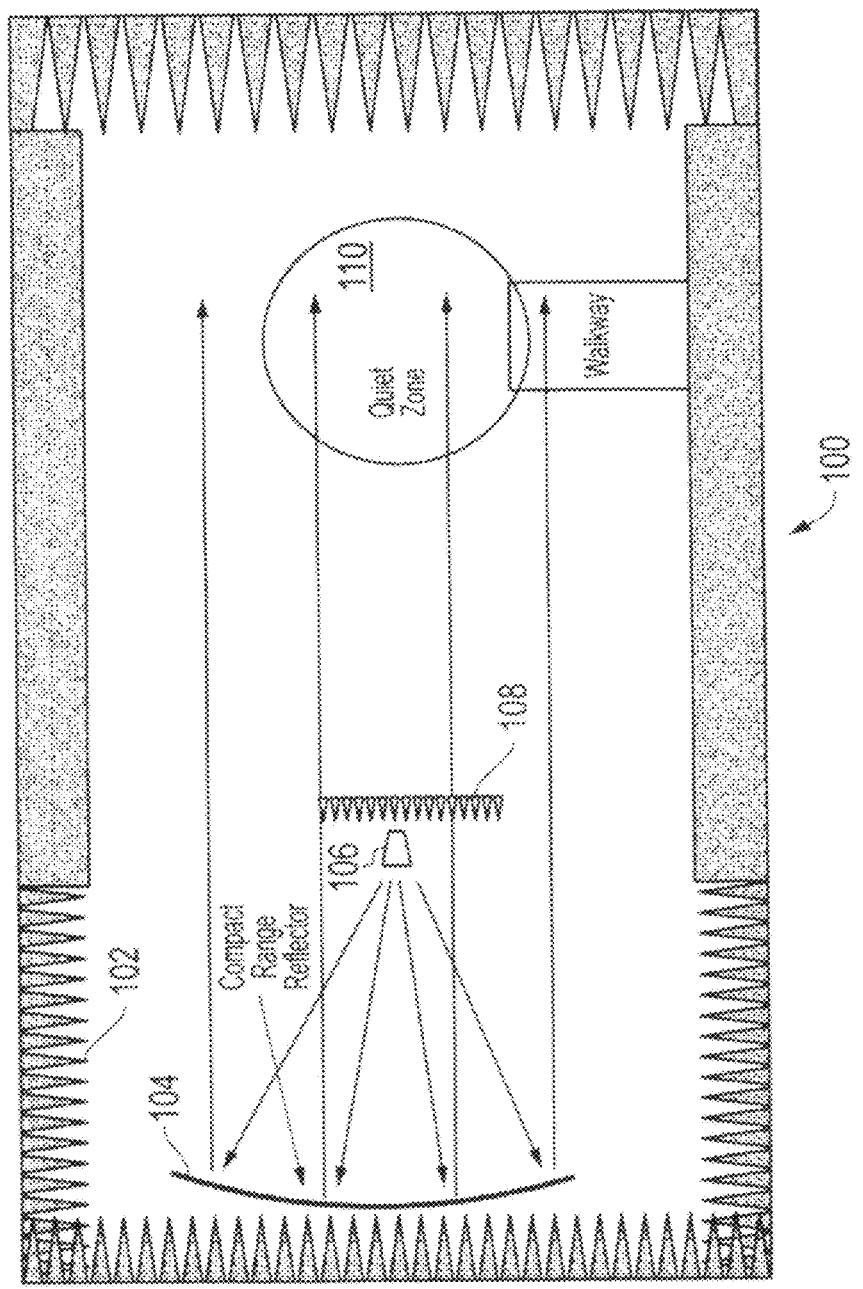
FIG. 1A depicts an anechoic chamber side view.
Figure 1B:
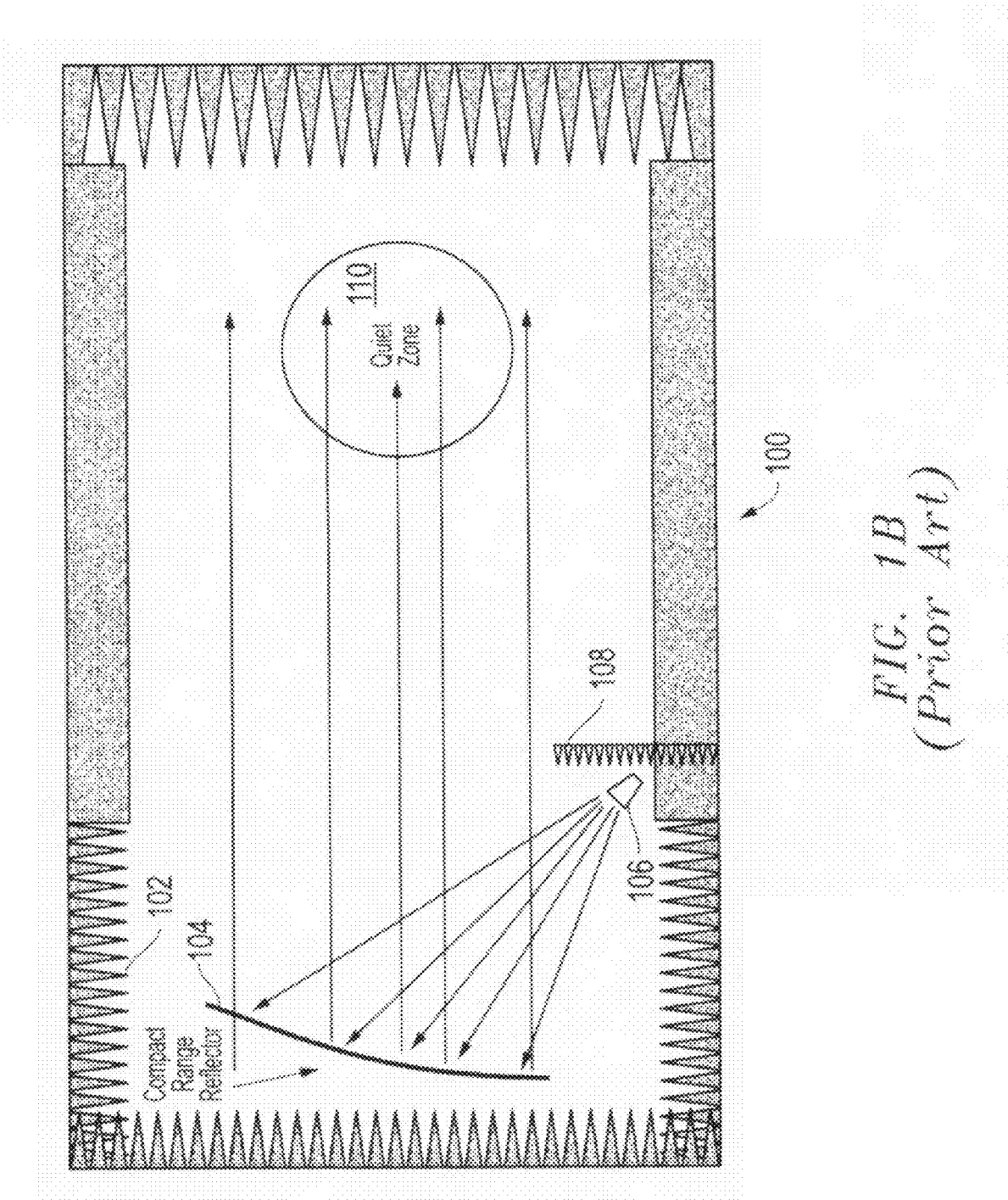
FIG. 1B depicts an anechoic chamber top view.

Electromagnetic anechoic chambers may be used for a variety of purposes including measuring the radiation pattern of a large antenna or the radar cross section of a flying object. Some applications require measurement at Radio Frequencies (RF) as low as about 100 Mega Hertz (MHz). FIG. 1A shows a side view of an anechoic chamber 100 and FIG. 1B shows a top view of anechoic chamber 100. Anechoic chamber 100 has a ceiling, walls and floor substantially covered with RF absorber material 102 to prevent reflection from these surfaces. A reflector 104 typically made of a good conductor and parabolic in shape is provided to collimate spherical waves emitted by a source 106 into a wave that is planar in its wave-front in the quiet zone 110 (also referred to as the test zone.) (Behind source 106 is absorbing material 108 to absorb any field energy backscattered by source 106.)

A compact test range is a highly effective test facility, for example, if the far-field or plane wave test condition $R \gg 2D^2/\lambda$ (where R is the test distance between the object and the signal source, D is the largest dimension of the test object, and $\lambda$ is the wavelength of the test signal) is satisfied. This condition, however, may be cost prohibitive to facilitate when the test object is many wavelengths in its electrical size. The compact range technique is especially feasible when the reflector dimensions are electrically large (much, much greater than the wavelength of the source).

Figure 3:
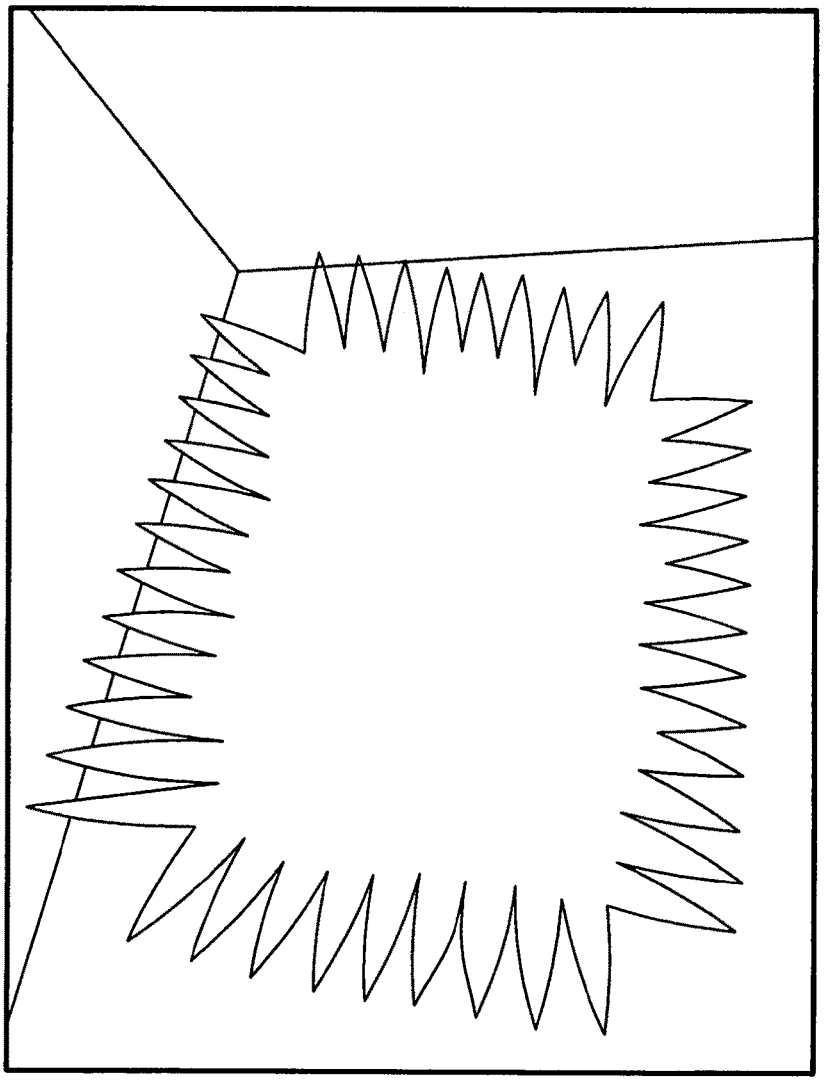
FIG. 3 depicts a reflector with a serrated edge to reduce edge effects.
Figure 4:
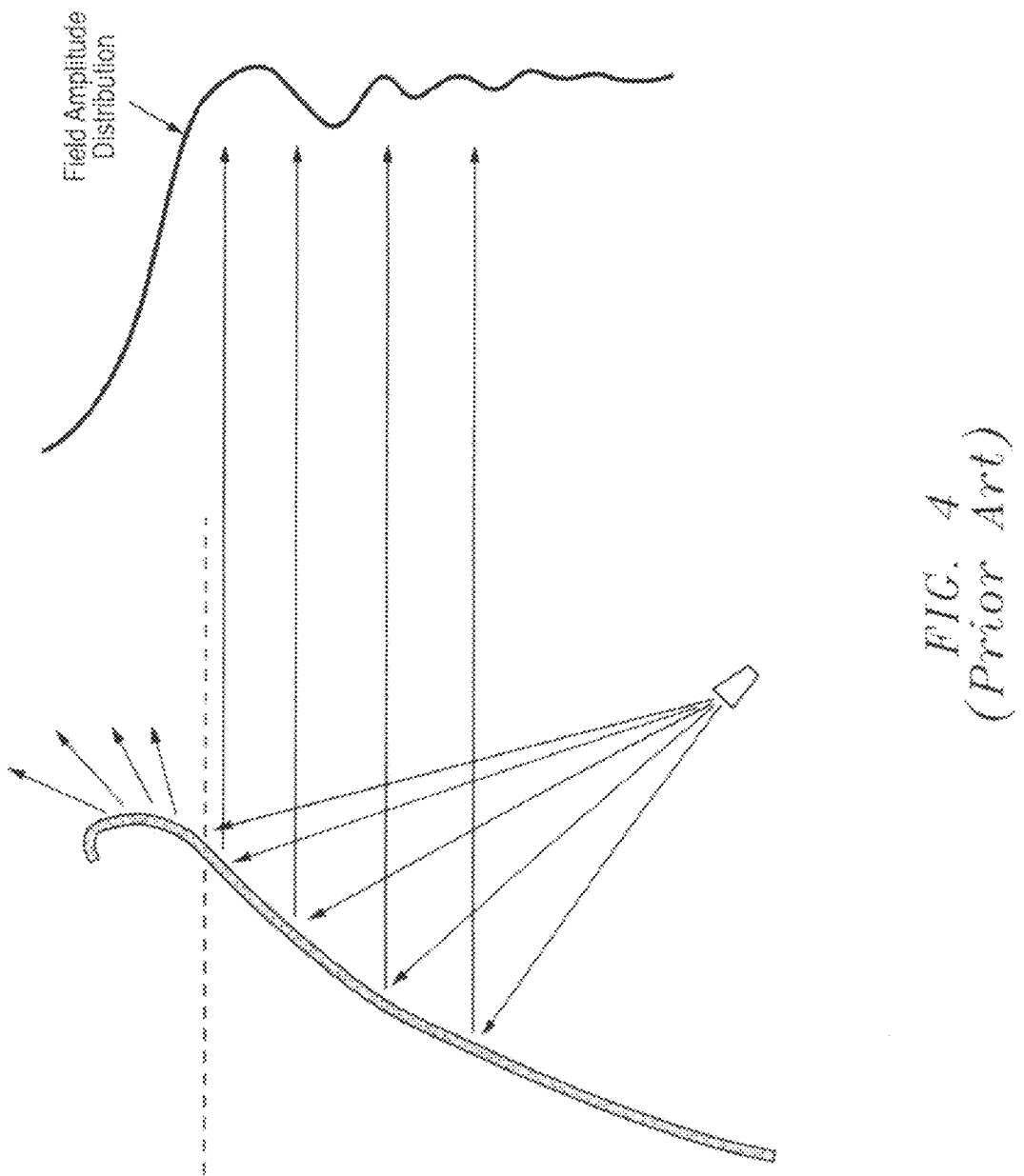
FIG. 4 depicts a reflector with a rolled back edge to reduce edge diffraction.

FIG. 2 shows diffraction from an edge 202 of a compact range reflector 204 illuminated by a source 206. The diffractions from the edges of the reflector will distort the field distribution in the test zone 210, thereby distorting the measurement. The larger the wavelength of the source, (i.e., the lower the source frequency), the more distortion due to edge diffraction there will be. Attempts to decrease the field distortion in the test zone due to diffraction from the edge of the reflector include serrations of the edges of the reflector, as shown in FIG. 3. Another approach to reduce diffractions is to roll back the edges as shown in FIG. 4.

There are drawbacks to these two approaches. First, the main parabolic surface of the reflector needs to be about 10 to 20$\lambda$ in dimension for the lowest operational frequency of the source. For the serrations or rolled-back edge to be successful at reducing the amplitude of distortion in the quiet zone, the serrations or rolled edges may add another 10$\lambda$ to each linear dimension of the reflector. Also, clearance between the edges of the reflector and the tips of the absorber material 102 add another 4$\lambda$ to each dimension. Thus, a minimum linear dimension of the test chamber is often seen to be at least 28 to 30$\lambda$, including the depth of the absorbers. That would require, for frequencies at or below 100 MHz, a reflector on the order of 300 by 300 feet using the above described edge termination methods. Some have proposed a metalized cloth to manufacture a reflector that large. Clearly, a different solution is desired.

Figure 5A:
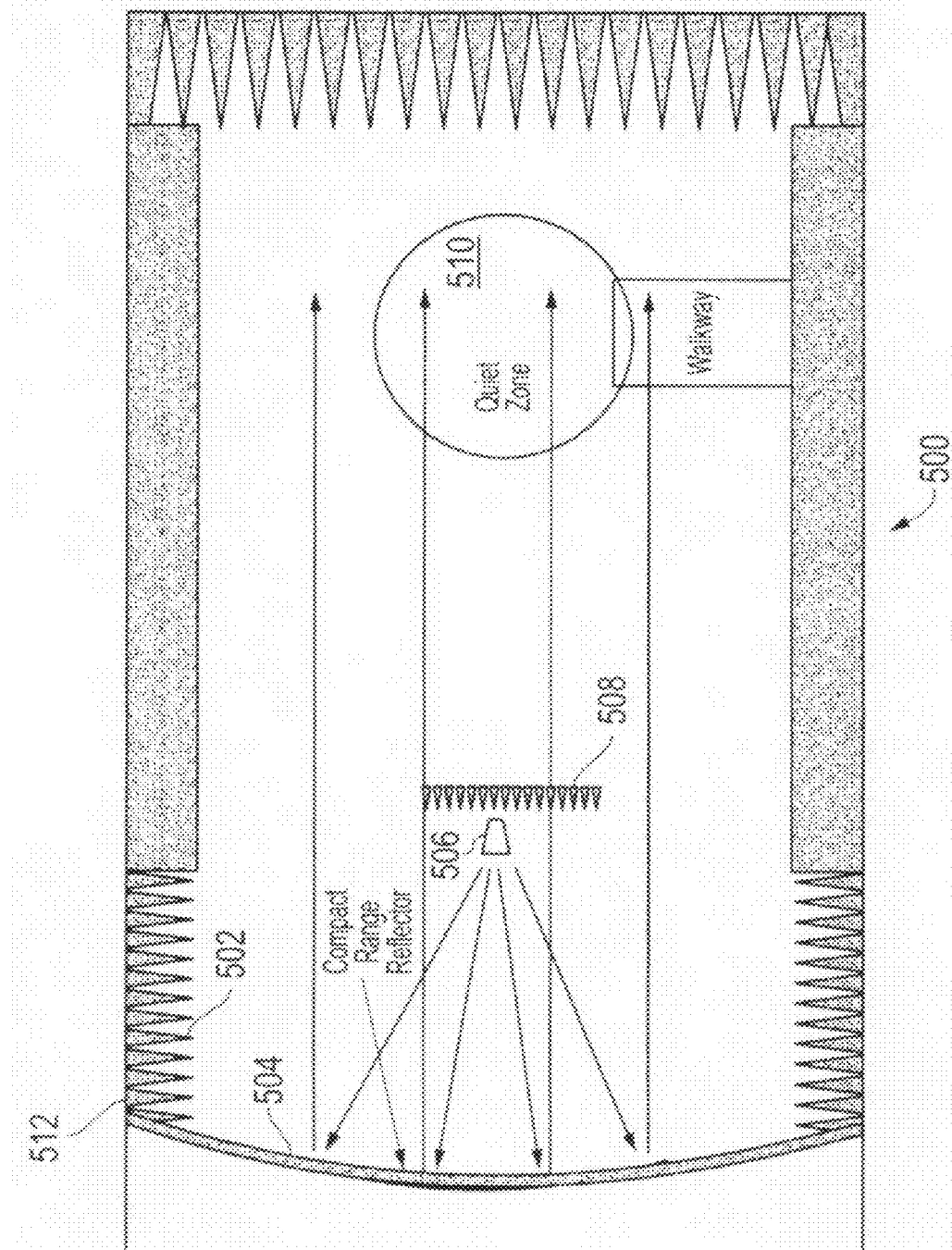
FIG. 5A depicts an anechoic chamber according to one embodiment side view.
Figure 5B:
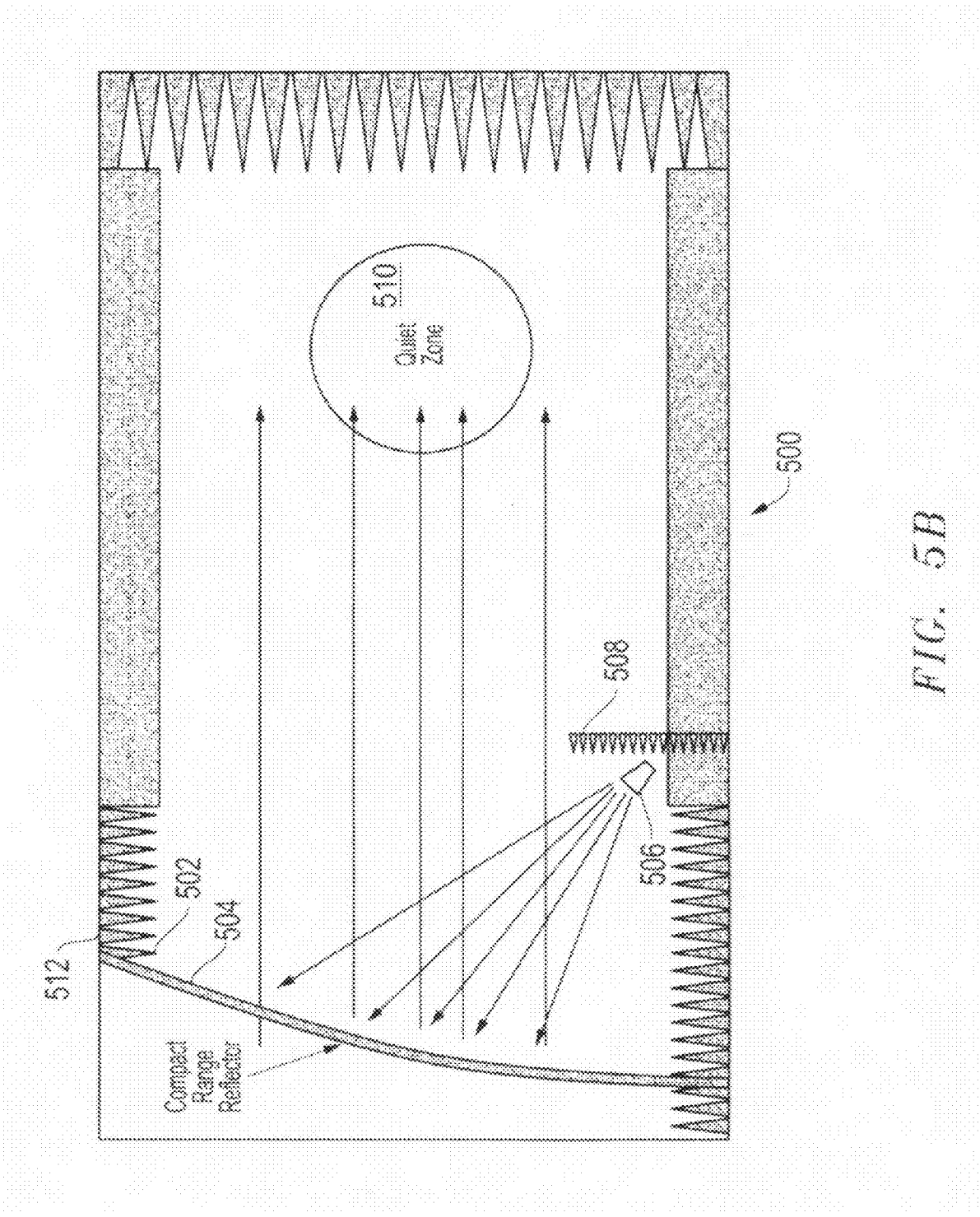
FIG. 5B depicts an anechoic chamber top view.

FIG. 5A shows a top view and FIG. 5B shows a side view of an integrated chamber 500 with absorber 502 and the compact range reflector 504 with a source 506 and a test zone 510. To substantially reduce or practically eliminate edge diffractions, the outer periphery of the reflector 504 is extended all the way to the walls, floor, and ceiling (peripheral surfaces of the chamber) as shown at 512. Moreover, the edge is fully embedded in the absorber 502 and obscured thereby so that energy incident on to and/or scattered from the edges of reflector 504 is almost fully absorbed by the RF absorber wall 502. In some embodiments, the absorber 502 has a dimension of about a half wavelength to a wavelength. In one embodiment, the edge extends all the way to the peripheral surfaces of the chamber and is conductively adjoined to those surfaces. For example, the edge of the reflector may be connected to the peripheral surfaces of the chamber by way of detachable electrically conductive tape, wherein the peripheral surfaces of the chamber are electrically conductive.

Thus, some embodiments comprise an anechoic chamber with interior peripheral surfaces of the chamber lined with absorber. A reflector receives electromagnetic energy from a source and reflects substantially all the received energy to form a substantially plane wave in a test zone, the reflector exhibiting an outer peripheral edge that extends to the interior peripheral surfaces. In some embodiments the outer peripheral edge of the reflector extends into a region of absorber that lines the interior peripheral surfaces of the chamber. In some embodiments the outer peripheral edge of the reflector is in conductive contact with the interior peripheral surfaces of the chamber. In some embodiments, the reflector extends over substantially an entire cross section of the chamber (wall to wall and ceiling to floor.)

Figure 6:
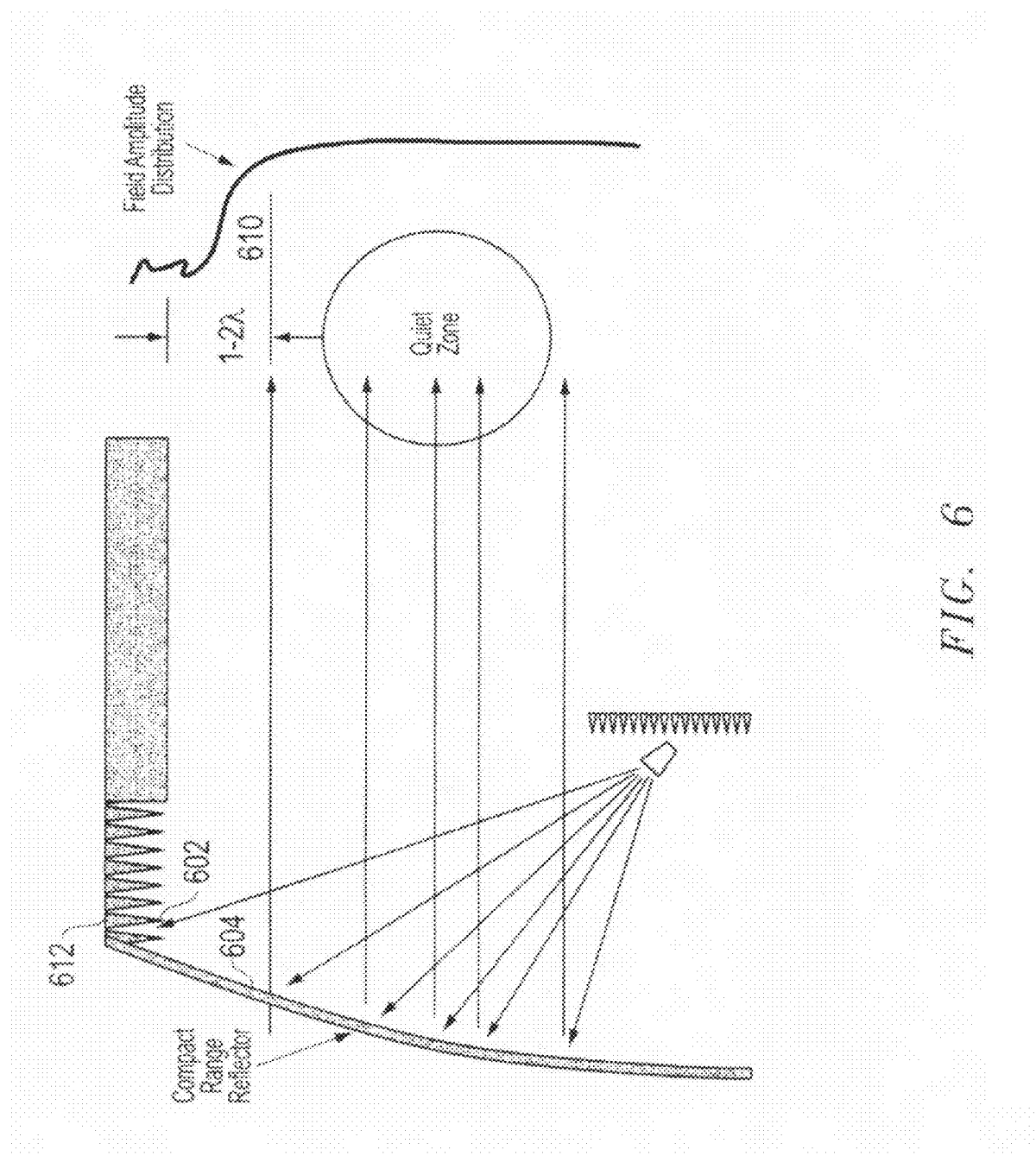
FIG. 6 depicts a reflector absorber interface.

FIG. 6 shows edge 612 of reflector 604 terminated at a wall of the chamber. Absorber 602 absorbs electromagnetic waves traveling toward edge 612 of reflector 604, and further absorbs energy traveling from edge 612 toward far field zone 610. Thus, distortion in the ideally planar wave-front in the test zone caused by edge diffraction is reduced. Note, as FIG. 6 shows, that the additional length added to the dimension of the reflector is on the order of 1 or 2λ or the depth of the RF absorbers. This is a considerable improvement over using serrated or rolled edges and allows for ranges that are much more compact. In one embodiment, the anechoic absorbers 602 placed where the edge 612 of the reflector 604 meets the wall will have at least 30 dB (decibels) in reflection loss so that the amplitude ripples in the test zone will be less than +/−0.25 dB.

The wave-front collimation surface can extend over the entire cross section of the chamber. Using the methods described herein, a collimated wave front without substantial distortion from edge diffractions can be produced in a chamber with as small a cross section as 5λ by 5λ. At 100 MHz, the chamber cross section could be as small as 55 feet by 55 feet.

Some embodiments provide methods for producing an electromagnetic field in a chamber forming a compact range that substantially reduces scattering from the edge of the reflector of the chamber. One method comprises positioning a directional source of spherical waves to irradiate the reflector. The reflector is positioned and shaped to receive electromagnetic radiation from the source and to reflect the received radiation to form substantially planar wave-fronts in a test zone. An outer periphery of the reflector, which in one embodiment is non-serrated, extends substantially to peripheral surfaces of the chamber so that the reflector exhibits a surface that extends substantially over an entire cross section of the chamber. In some embodiments, a substantial portion of the outer periphery of the reflector extends to peripheral surfaces of the chamber and is conductively terminated to the interior surfaces of the shielded anechoic chamber. In some embodiments, the outer periphery of the reflector is embedded in absorber that lines the peripheral surfaces of the chamber. In some embodiments, a gap between an outer periphery of the reflector and a peripheral surface of the chamber much less than a wavelength at its lowest operating frequency is left for either conductive or resistive contacts to form the continuity of electrical contact between the reflector and the chamber.

The present embodiments and some of their advantages have been described in detail. It should be understood that various changes, substitutions and alterations can be made herein without departing from the spirit and scope of the invention as defined by the appended claims. An embodiment of the invention may achieve multiple objectives, but not every embodiment falling within the scope of the attached claims will achieve every objective. Moreover, the scope of the present application is not intended to be limited to the particular embodiments of the process, machine, manufacture, composition of matter, means, methods and steps described in the specification. One of ordinary skill in the art will readily appreciate from the disclosure of the present invention that processes, machines, manufacture, compositions of matter, means, methods, or steps, presently existing or later to be developed are equivalent to, and fall within the scope of, what is claimed. Accordingly, the appended claims are intended to include within their scope such processes, machines, manufacture, compositions of matter, means, methods, or steps.

What is claimed is:

1. A method of providing an electromagnetic field in an anechoic chamber, the method comprising providing a substantially vertical parabolic reflector with an outer periphery that extends substantially to a ceiling, a floor, and vertical walls of the anechoic chamber that are not formed by the parabolic reflector to substantially reduce diffraction by edges of the parabolic reflector, a substantial portion of the outer periphery of the parabolic reflector being conductively terminated at walls of the anechoic chamber.

2. The method of claim 1, wherein a substantial portion of the outer periphery of the parabolic reflector is resistively terminated at walls of the anechoic chamber.

3. The method of claim 1, wherein the outer periphery of the parabolic reflector is embedded in absorber that lines the floor and ceiling of the chamber.

4. The method of claim 3, wherein the outer periphery of the parabolic reflector is embedded in absorber that lines a ceiling of the chamber.

5. The method of claim 1, wherein the edges of the parabolic reflector are not rolled back.

6. The method of claim 1, wherein the edges of the parabolic reflector are not serrated.

7. A compact range having at one end a reflector that substantially extends to first walls of the range to substantially reduce diffraction from edges of the reflector, the first walls being substantially parallel to a direction of propagation between the reflector and a test zone, the first walls extending to an opposite end of the range and at least partially enclosing the test zone.

8. The compact range of claim 7, wherein a gap between an edge of the reflector and the first walls of the contact range is substantially less than a wavelength of electromagnetic energy illuminating the test zone.

9. The compact range of claim 7, wherein an edge of the reflector is embedded in absorber material lining the first walls of the range.

10. The compact range of claim 7, wherein a face of the reflector is substantially perpendicular to a direction of propagation of electromagnetic energy propagating from the reflector to the test zone.

* * * * *